Figure 1:
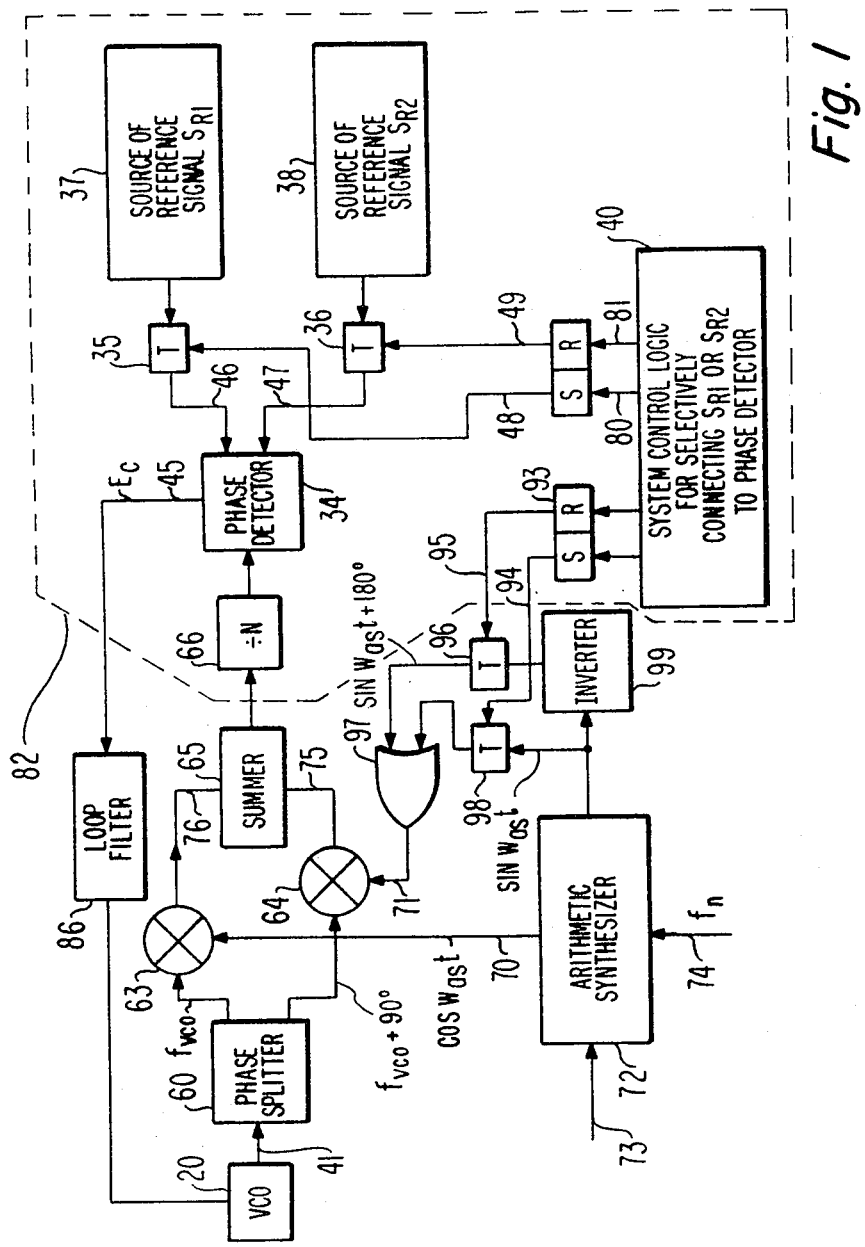

United States Patent [19]

Crowley et al.

[11] Patent Number: 4,464,638

[45] Date of Patent: Aug. 7, 1984

[54] UNIVERSAL DIGITAL FREQUENCY SYNTHESIZER USING SINGLE SIDE BAND TECHNIQUES

[75] Inventors: Albert T. Crowley, Somerdale; Robert M. Lisowski, Cherry Hill, both of N.J.

[73] Assignee: RCA Corporation, New York, N.Y.

[21] Appl. No.: 326,136

[22] Filed: Nov. 30, 1981

[51] Int. Cl.$^3$ .............................................. H03L 7/18
[52] U.S. Cl. .................................... 331/1 A; 331/14; 331/22; 331/25
[58] Field of Search ..................... 331/1 A, 31, 14, 16, 331/18, 19, 22, 25

[56] References Cited

U.S. PATENT DOCUMENTS

| | | | |
|---|---|---|---|
| 2,843,740 | 7/1958 | Mantz et al. | 331/2 |
| 2,860,246 | 11/1958 | Jakubowics | 331/19 |
| 3,251,002 | 5/1966 | Willmann et al. | 331/8 |
| 3,274,511 | 9/1966 | Dale et al. | 331/1 A |
| 3,943,459 | 3/1976 | Tosto | 331/4 |
| 4,061,973 | 12/1977 | Reimers et al. | 455/76 |

Primary Examiner—Siegfried H. Grimm
Assistant Examiner—David C. Mis
Attorney, Agent, or Firm—J. S. Tripoli; R. L. Troike; D. W. Phillion

[57] ABSTRACT

An improvement in a digital frequency synthesizer comprising a voltage-controlled oscillator (VCO) for producing a signal $S_{VCO}$ having a frequency $f_{VCO}$, a first signal generator for generating a plurality of signals $S_{AS}$ having a spectrum of frequencies $f_{AS}$, all exceeding a given minimum frequency $f_M$, a mixer responsive to $S_{VCO}$ and to $S_{AS}$ to produce an output signal having a frequency $(f_{VCO} \pm f_{AS})$, a divide-by-N divider responsive to $(f_{VCO} \pm f_{AS})$ to produce a signal $S_N$ having a frequency $f_N$, a second signal generator for generating a first reference signal $S_{R1}$ having a frequency $f_{R1}$, a phase detector responsive to $S_N$ and $S_{R1}$ to produce a d.c. control signal $E_c$ whose amplitude varies with the phase relation of $S_N$ and $S_{R1}$, and a filter for supplying $E_c$ back to said VCO, the VCO being responsive to $E_c$ to produce an output signal $S_{VCO}$ of frequency $f_{VCO}$ where $(f_{VCO} \pm f_{AS}) = Nf_{R1}$, an improvement for generating signals in the frequency range $Nf_{R1} \pm f_M$ and comprising a third signal generator for generating a second reference signal $S_{R2}$ having a frequency $f_{R2}$ where $(Nf_{R2} + f_M) \leq (Nf_{R1} - f_M)$. Also provided is logic responsive to system frequency requirements that the VCO generate a signal having a frequency between $(Nf_{R1} \pm f_M)$ to supply $S_{R2}$ to the phase detector in lieu of $S_{R1}$.

4 Claims, 5 Drawing Figures

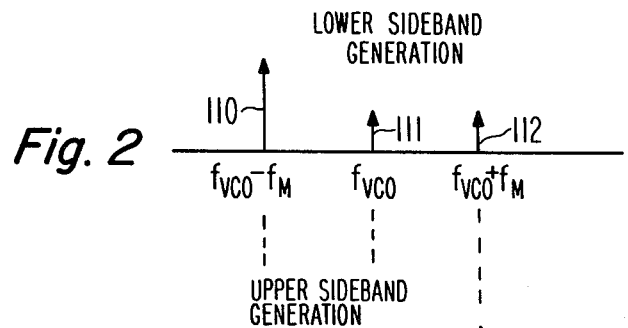
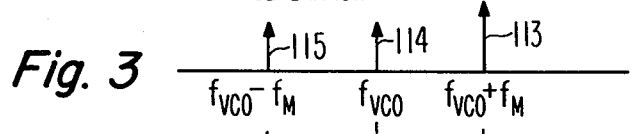
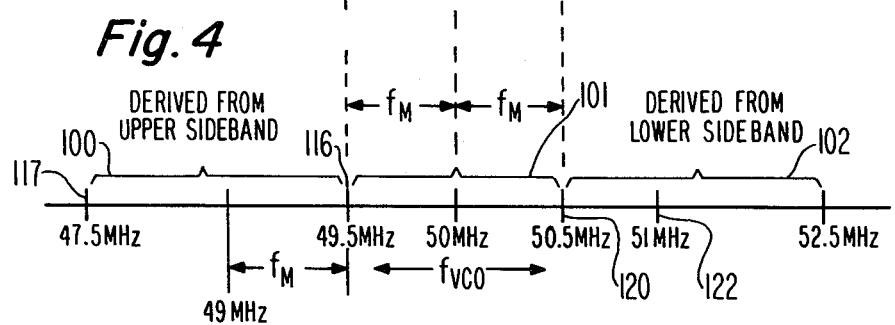
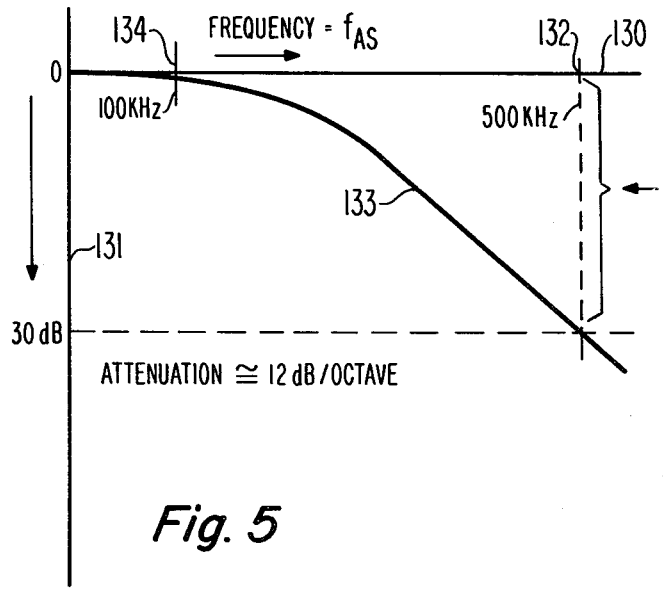

UNIVERSAL DIGITAL FREQUENCY SYNTHESIZER USING SINGLE SIDE BAND TECHNIQUES

This invention relates generally to frequency synthesizers and more particularly to a universal frequency synthesizer capable of fast switching times with fine frequency resolution.

A commonly used prior art frequency synthesizer is the conventional divide-by-N phase locked loop design that generates frequencies which are multiples of a reference frequency. More specifically, such a frequency synthesizer consists of a voltage-controlled oscillator (VCO), divide-by-N logic which divides the output frequency of the VCO by N to produce a signal $S_N$ of frequency $f_N$, and a phase detector which receives at one input thereof the output of the divider and at the other input thereof the reference frequency signal $S_R$ of frequency $f_R$. The output of the phase detector is supplied back to the frequency control input of the VCO through a loop filter so that the output frequency of the VCO, after being divided by N, is equal to the frequency of the reference signal. Because such conventional divide-by-N frequency synthesizers generate only frequencies which are multiples of the reference frequency, the loop filter will have a bandwidth of only 10 to 20 percent of the channel spacing between selectable frequencies, thus resulting in unacceptably slow switching times in most applications.

The prior art also teaches the use of the well known arithmetic frequency synthesizer to generate a spectrum of frequencies. The arithmetic synthesizer approach employs an accumulator to which is supplied a value $V_n$ which represents a step in phase. Such value $V_n$ is repeatedly added to the contents of the accumulator at a given clock rate with the accumulator overflowing periodically, which defines its cyclical frequency $f_{AS}$. Thus, total (overflow) capacity of the accumulator represents 360° or one full cycle of $f_{AS}$. At any given time therefore, the digital parallel output of the accumulator is the digital phase of the desired output frequency. Such digital output of the accumulator can be converted to a sine wave using a read-only-memory (ROM) as a sine look-up table and a digital-to-analog converter (DAC) to convert the ROM outputs to analog signals. As will be discussed in more detail later herein, when a single side band modulator is employed both sine and cosine outputs from the arithmetic synthesizer are required. Thus, in addition to the sine look-up table and a first DAC, a cosine look-up table and a second DAC are also required. Frequency synthesizers employing an arithmetic synthesizer can generate very fine frequency increments and shift frequencies very fast but are limited to low frequency applications. Multiplication of the output signals of the DAC will increase spurious signals to unacceptable levels. A narrow band multiplier can be employed to filter the undesired spurious signals but only at the expense of lowering the switching speed.

Another more recent development combines the direct arithmetic synthesizer and the conventional divide-by-N phase-lock loop to obtain the advantages offered by both techniques. This system consists of a divide-by-N translation loop, as described above, to generate coarse frequency increments and an arithmetic frequency synthesizer to generate fine frequency increments. The coarse and fine frequency increments are combined using single sideband modulation techniques and employing a pair of I and Q mixers responsive to the I and Q components of the VCO and also responsive to the I and Q components supplied from the arithmetic frequency synthesizer. The outputs of the I and Q mixers are combined in a summing circuit to produce the sum $(f_{VCO}+f_{AS})$ or the difference $(f_{VCO}-f_{AS})$. However, spurious signals generated by such systems can fall within the loop bandwidth and cause undesired spurious signals close to the synthesizer output frequency. Furthermore, additional spurious signals close to the synthesizer output frequency are created by the sampling process of the divide-by-N which replicates the input spectrum at all harmonics of the reference frequency $f_R$. Such spurious signals are fed back to the VCO to produce undesired perturbation in the output frequency of said VCO and thus in the synthesizer output frequency. Such spurious signals can be avoided by maintaining the output of the single sideband modulator signal $(f_{VCO}+f_{AS})$ or $(f_{VCO}-f_{AS})$ at a frequency which is approximately five times the loop bandwidth of the system and maintaining reference frequency $f_R$ sufficiently high to prevent aliasing.

For example, if the loop bandwidth is assumed to be 100 KHz, then the minimum frequency output of the arithmetic synthesizer is 500 KHz. This results in the single sideband signal frequencies $(f_{VCO}+f_{AS})$ or $(f_{VCO}-f_{AS})$ being 500 KHz on either side of the output frequency $f_{VCO}$ of the VCO. Thus, there is a resultant frequency bandwidth of approximately 1 MHz or 500 KHz on either side of $f_{VCO}$, in which output signals cannot be generated by the system.

The present invention provides logic for generating output signals in the aforementioned resultant frequency bandwidth on either side of the frequency $f_{VCO}$, without the generation of the spurious signals found in the prior art systems.

In accordance with the one preferred form of the invention there is provided, in a digital frequency synthesizer having a voltage-controlled oscillator (VCO) for producing a signal $S_{VCO}$ of a frequency $f_{VCO}$, a first signal generator for generating a plurality of signals $S_{AS}$ having a spectrum of frequencies $f_{AS}$, all exceeding a given minimum frequency $f_M$, a mixer responsive to $S_{VCO}$ and $S_{AS}$ to produce an output signal of a frequency $(f_{VCO} \pm f_{AS})$, a divide-by-N divider responsive to $(f_{VCO} \pm f_{AS})$ to produce a signal $S_N$ of a frequency $f_N$, a first reference signal generator for generating a first reference signal $S_{R1}$ of a frequency $f_{R1}$, a phase detector responsive to $f_N$ and $f_{R1}$ to produce a variable unipolar control signal $E_c$ whose amplitude varies with the phase relationship of $S_N$ and $S_{R1}$, and a loop filter for supplying said control signal $E_c$ back to the VCO, the VCO being responsive to $E_c$ to produce an output signal of frequency $f_{VCO}$, where $(f_{VCO} \pm f_{AS}) = Nf_{R1}$; an improvement for generating signals in the frequency range $(Nf_{R1} \pm f_M)$ and comprising a second reference signal generator for generating a second reference signal $S_{R2}$ of a frequency $f_{R2}$ where $(Nf_{R2} \pm f_M) \leq (Nf_{R1} \pm f_M)$, and logic responsive to system frequency requirements to generate a signal having a frequency between $(Nf_{R1} \pm f_M)$ to connect $S_{R2}$ to the phase detector in lieu of $S_{R1}$.

In the drawings:

FIG. 1 is a block diagram of one form of the invention;

FIGS. 2 and 3 each show a line chart of a frequency spectrum to facilitate an understanding of the structure of FIG. 1;

FIG. 4 is another line chart of a frequency spectrum related to the structure of FIG. 1; and FIG. 5 shows a frequency vs. attenuation characteristic curve relating to the loop bandwidth of the structure of FIG. 1.

Referring now to FIG. 1, the output signal $S_{VCO}$ of frequency $f_{VCO}$ of VCO 20 is supplied to phase splitter 60 and then in phase quadrature to mixers 63 and 64. The arithmetic synthesizer (AS) 72 also supplies phase quadrature output signals to mixers 63 and 64 of a frequency $f_{AS}$. More specifically, the signal supplied to mixer 63 from AS 72 via lead 70 is cosine $\omega_{AS}t$ and the signal supplied to mixer 64 via lead 71 can either be sine $\omega_{AS}t$ or sine $\omega_{AS}t+180°$, depending upon whether transmission gate 98 or 96, respectively, is enabled. Assume that signal sine $\omega_{AS}t$ is being supplied to mixer 64. It is well known in the art that the supplying of the quadrature outputs of phase splitter 60 to mixers 63 and 64 and the simultaneous supplying of the quadrature outputs of AS 72 to mixers 63 and 64 will result in a single sideband output signal from summer 65. Such single sideband signal can be either the lower sideband, as shown in FIG. 2, or the upper sideband, as shown in FIG. 3. The vertical bars 111 and 112 in FIG. 2 respectively represent the suppressed center frequency $f_{VCO}$ and the suppressed upper sideband or image frequency $f_{VCO}+f_M$. In FIG. 3 the upper sideband is represented by vertical bar 113 and the vertical bars 114 and 115, respectively, represent the suppressed center frequency $f_{VCO}$ and the suppressed lower sideband 115, or image signal of frequency $(f_{VCO}+f_M)$.

Assume further that the signal sine $\omega_{AS}T$, supplied from AS 72 to mixer 64 through transmission gate 98, will result in the generation of the lower sideband signal of FIG. 2 and that the supplying of the signal sine $\omega_{AS}t+180°$ to mixer 64 will result in the generation of the upper sideband 113 as shown in FIG. 3. The selection of one of the two sine function outputs of AS 72 is determined by the enabling of either transmission gate 96 or 98 by control signals from control logic 40. Specifically, enabling of transmission gate 98 will supply the sine $\omega_{AS}t$ signal to mixer 64 through OR gate 97. Enabling of transmission gate 96 will invert such signal in inverter 99 to supply the signal sine $\omega_{AS}t+180°$ through OR gate 97 to mixer 64.

As discussed in detail later herein, the selection of the upper sideband 113 of FIG. 3 by enabling transmission gate 96 will result in the enabling of the system to generate frequencies within the spectrum of the frequencies defined by bracket 100 of FIG. 4. Generation of the lower sideband 110 of FIG. 2 by enabling transmission gate 98 will enable the system to generate signals having frequencies within the spectrum defined by bracket 102 in FIG. 4. The foregoing spectrums of possible generated signals within brackets 100 and 102 are based on the assumption of the nominal output frequency of summer 65 being 50 MHz, the frequency range of the arithmetic synthesizer being from 0.5 MHz to 2.5 MHz, and the permissible frequency distance of the sideband and its image from the nominal center frequency $f_{VCO}$ being $f_M=0.5$ MHz because of the filter loop bandwidth.

It should be pointed out that generation of signals by the system having frequencies defined by the bracket 101 in FIG. 4 are non-attainable with the single reference signal $S_{R1}$, since the minimum frequency provided by AS 72 is $f_{AS}=500$ KHz, which is determined by the loop bandwidth of the system as discussed above. Thus, the upper sideband 113 of FIG. 3 will have a frequency of 50.5 MHz in the absence of any frequency control of VCO 20, i.e., assuming that the frequency of the output of VCO 20 remains at 50 MHz. However, the frequency $f_N$ of the signal $S_N$ supplied to phase detector 34 must be equal to the frequency $f_{R1}$ of reference signal $S_{R1}$ when the loop is locked which, in the example being employed, is 5 MHz. Thus, the output $S_N$ of divider 66 must always result, after settling of the circuit to its final frequency, of a signal having a frequency of 5 MHz. Since $N=10$, the output of summer 65 must thus be 50 MHz, which includes the 500 KHz output signal of AS 72. Accordingly, the output frequency of VCO 20 must be 50 MHz−500 KHz or 49.5 MHz as represented by bar 116 of FIG. 4. If the output of AS 72 is increased to 2.5 MHz then the output frequency of VCO 20 must decrease to 47.5 MHz in order for the sum of the two frequencies $(f_{VCO}+f_{AS})$ to be equal to 50 MHz at the output of summer 65. Signals generated by VCO 20 having frequencies between 47.5 MHz and 49.5 MHz can be obtained by selecting frequency values generated by AS 72 between 0.5 MHz and 2.5 MHz. Also, AS 72 can be constructed, for example, to have incremental frequency jumps of 25 KHz, or less or more, depending upon the requirements of the particular application of the system.

The supplying of the signal sin $\omega_{AS}t$ to mixer 64 will, as stated above, result in the generation of the lower sideband 110 shown in FIG. 2, which is formed by subtracting the frequency output of AS 72 from the $f_{VCO}$ frequency output of VCO 20. If it is assumed that the output of AS 72 is 500 KHz, then, in the absence of any feedback to VCO 20, the output of summer 65 will be (50 MHz−500 KHz) or 49.5 MHz assuming that the output of VCO 20 remains at 50 MHz. However, as discussed above, the output $S_N$ from divider 66 must be equal to $f_{R1}=5$ MHz when the loop is locked so that the input to divider 66 must be 50 MHz. In order to meet such a condition, the frequency of the output of VCO 20 must increase to 50.5 MHz as indicated at bar 120 of the line chart of FIG. 4. If the frequency output $f_{AS}$ of AS 72 is increased to its maximum value of 2.5 MHz then the output of VCO 20 must increase to 52.5 MHz in order that the frequency of the signal supplied to divide-by-N circuit 66 will be 50 MHz. Frequencies between 50.5 MHz and 52.5 MHz can be generated by VCO 20 by the selection of frequencies between 0.5 MHz and 2.5 MHz from AS 72.

As discussed above, the frequencies between 49.5 MHz at bar 116 of line chart in FIG. 4 and 50.5 MHz at bar 120 of FIG. 4 cannot be obtained with the use of only the single reference signal frequency $f_{R1}$ generated by signal source 37. A second reference signal $S_{R2}$ generated by signal source 38 and having a frequency $f_{R2}=4.9$ MHz is employed in the present invention to enable the system to generate frequencies at the output of VCO 20 between 49.5 MHz and 50.5 MHz and lying within the bracket 101 in FIG. 4. Specifically, with the frequency values employed in the present example, and if $f_{R2}$ is made equal to 4.9 MHz, the frequencies within the bracket 101 can be generated without having a spurious signal occur closer to $Nf_{R2}=49$ MHz than 500 KHz.

More specifically, with a second reference frequency of 4.9 MHz the output frequency $Nf_{R2}$ of summer 65 (with $N=10$) must be 49 MHz. Then with the selection of the lower sideband 110 of FIG. 2, the minimum frequency output from AS 72 of 500 KHz will result in an output signal from VCO 20 of 49.5 MHz since the output of summer 65 must remain at 49 MHz (49.5 MHz-0.5 MHz=49 MHz). If the output frequency of AS 72 is increased to 1.5 MHz then the output of VCO 20 must have a frequency of 50.5 MHz, (50.5 MHz−1.5 MHz=49 MHz) as indicated at bar 120 in the line chart of FIG. 4. The values of the output frequency of AS 72 between 0.5 MHz and 1.5 MHz will result in the generation of signals having frequencies within bracket 101 and between frequencies 49.5 MHz and 50.5 MHz, while still maintaining a frequency distance of at least 500 KHz between the output of VCO 20 and the generated frequency.

It is to be understood that the value of N can be changed to any integral value within the operation limits of the system. For example, N can be equal to 16 in which case the nominal output frequency of VCO 20, in the absence of corrective feedback thereto through loop filter 86 and employing a reference signal of 5 MHz, will be equal to 16×5 MHz or 80 MHz. The minimum values of the lower and upper sideband frequencies will then be 79.5 MHz and 80.5 MHz, respectively. The maximum values of the lower and upper sideband (determined by the maximum output frequency of 2.5 MHz) from AS 72 will then be equal, respectively, to 77.5 MHz and 82.5 MHz. The frequency range between 79.5 MHz and 80.5 MHz will then be generated by switching to the second reference signal $S_{R2}$ of a frequency $f_{R2}$ equal to 4.9 MHz and applying $f_{AS}$ in the range of 1.1 MHz to 2.1 MHz in a manner similar to that described above when the nominal value of $f_{VCO}$=50 MHz.

Referring now to FIG. 5 there is shown a frequency response curve 133. In FIG. 5 the horizontal axis 130 represents frequency and the vertical axis 131 shows the attenuation in dB's which, in the example described herein, is about 12 dB per octave.

A spurious signal 100 KHz removed from the signal being generated by VCO 20, as represented by line 134 in FIG. 5 along the horizontal axis 130, will experience very little attenuation and accordingly will result in objectionable perturbations in the frequency output of VCO 20.

On the other hand, a spurious signal occurring 500 KHz away from the signal being generated by VCO 20, in the example described above, will have an attenuation of about 30 decibels. This is in addition to the attenuation of $f_{VCO}$ and the image generated by the single sideband modulator comprised of elements 60, 63, 64, 65 of FIG. 1 and will produce negligible perturbations in the output frequency of VCO 20.

In the example described above, the loop bandwidth of the system has been measured to be 100 KHz. From the curve of FIG. 5, it can be seen that a spurious signal moving more than 100 KHz away from the signal being generated by the VCO will have increasing attenuation as shown by curve 133. Any degree of attenuation less than 30 decibels is deemed to be undesirable in most systems of the type shown in FIG. 1. Thus, the 500 KHz is defined as the minimum spurious frequency distance permissible in the present system.

What is claimed is:

1. In a phase locked loop frequency synthesizer having a loop bandwidth of X KHz and comprising a voltage controlled oscillator (VCO) for generating a signal $S_{VCO}$ of frequency $f_{VCO}$, means for selectively increasing or decreasing $f_{VCO}$ by a variable frequency $f_{AS}$ whose minimum value $\geq$ MX KHz, and where M>1, to selectively produce a spectrum of signals of frequencies $(f_{VCO} \pm f_{AS})$, means for dividing the frequencies $(f_{VCO} \pm f_{AS})$ by N to produce a signal $S_N$ of frequency $f_N=(f_{VCO} \pm f_{AS})/N$, means for generating a first reference signal $S_{R1}$ of frequency $f_{R1}$, logic including phase comparing means for comparing $S_N$ with $S_{R1}$ to produce a control signal $E_c$, said VCO being responsive to $E_c$ to alter its frequency so that $(f_{VCO} \pm f_{AS})/N=f_{R1}$;

means for generating a second reference signal $S_{R2}$ of frequency $f_{R2}$, where $(Nf_{R2}+M$ KHz$) \leq Nf_{R1}-M$ KHz; and means for supplying $S_{R2}$ to said phase comparing means in lieu of $S_{R1}$.

2. In a phase locked loop frequency synthesizer having a loop bandwidth of X KHz, and comprising a voltage-controlled oscillator (VCO) for generating in-quadrature signals $S_{VCO}$, of frequency $f_{VCO}$, a first signal generating means for generating a spectrum of in-quadrature signals $S_{AS}$, of frequency $f_{AS}$, all exceeding MX KHz, where M>1, logic means for processing said signals $S_{VCO}$ and $S_{AS}$ to produce an output signal $S_N$ of frequency $f_N=(f_{VCO} \pm f_{AS})/N$, where N is an integer, means for generating a first reference signal $S_{R1}$ of frequency $f_{R1}$, and phase detecting means for comparing the phase of said signals of $S_N$ and $S_{R1}$ to produce a control signal $E_c$, said VCO responsive to $E_c$ to alter its frequency output so that $f_N=f_{R1}$;

means for generating a second reference signal $S_{R2}$ of frequency $f_{R2}$ where $(Nf_{R2}+M$ KHz$) \leq (Nf_{R1}-M$ KHz$)$; and means for supplying $S_{R2}$ to said phase detecting means in lieu of $S_{R1}$.

3. In a digital frequency synthesizer comparing a voltage-controlled oscillator (VCO) for producing a signal $S_{VCO}$, having a variable frequency $f_{VCO}$, means for generating a variable signal $S_{AS}$ having a variable frequency $f_{AS}$ exceeding a given mininum frequency $f_M$, mixer means responsive to said signals $S_{VCO}$ and $S_{AS}$ to produce an output signal having a spectrum of frequencies $(f_{VCO} \pm f_{AS})$, divide-by-N means responsive to $(f_{VCO} \pm f_{AS})$ to produce a signal $S_N$ having a frequency $f_N$, reference signal generating means for generating a first reference signal $S_{R1}$ having a frequency $f_{R1}$, phase detector means responsive to said signals $S_N$ and $S_{R1}$ to produce a d.c. control signal $E_c$ whose amplitude varies with the phase relation of said signals $S_N$ and $S_{R1}$, and filter means for supplying $E_c$ back to said VCO, said VCO being responsive to $E_c$ to produce an output signal of frequency $(f_{VCO} \pm f_{AS})=Nf_{R1}$, an improvement for generating signals in the frequency range $(Nf_{R1} \pm f_M)$ comprising:

means for generating a second reference signal $S_{R2}$ having a frequency $f_{R2}$ where $(Nf_{R2}+f_M) \leq (Nf_{R1}-f_M)$; and means responsive to system frequency requirement that said VCO generate a signal having a frequency between $Nf_{R1} \pm f_M$ to disconnect said first reference signal generating means from said phase detector means and to connect said second reference signal generating means to said phase detector means.

4. In a phase locked loop frequency synthesizer having a loop bandwidth of X KHz, first signal generating means comprising a voltage-controlled oscillator (VCO) for generating a pair of in-quadrature signals $S_{VCO}$ and $(S_{VCO}+90°)$ each of a variable frequency $f_{VCO}$, second signal generating means for generating a pair of variable in-quadrature signals $S_{AS}$ and $(S_{AS}+90°)$ having a variable frequency $f_{AS}$, exceeding a given minimum frequency $f_M$, where $f_M > X$ KHz, logic means including a pair of mixer means, summing means, a divide-by-N means responsive to the said two pairs of in-quadrature signals $S_{VCO}$, ($S_{VCO}+90°$) and $S_{AS}$, ($S_{AS}+90°$) to produce an output signal $S_N$ of a frequency $f_N=(f_{VCO}\pm f_{AS})/N$, where $f_{AS}$ is added to or subtracted from $f_{VCO}$ depending upon the reversal or non-reversal of the phase of one of the in-quadrature signals supplied from said second signal generating means, first reference signal generating means for generating a first reference signal $S_{R1}$ of frequency $f_{R1}$, and phase detector means for comparing said signals $S_N$ and $S_{R1}$ to produce a control signal $E_c$, said VCO responsive to $E_c$ to alter its output frequency $f_{VCO}$ until $f_N=f_{R1}$, an improvement for generating frequencies in the frequency range $Nf_{R1}\pm f_M$ comprising:

second reference signal generating means for generating a second reference signal $S_{R2}$ of a frequency $f_{R2}$, where $(Nf_{R2}\pm f_M) \leq (Nf_{R1}-f_M)$; and means for disconnecting said first reference signal $S_{R1}$ from said phase detector means and for alternatively connecting said second reference signal $S_{R2}$ to said phase detector means.

* * * * *

UNITED STATES PATENT AND TRADEMARK OFFICE
CERTIFICATE OF CORRECTION

PATENT NO. : 4,464,638

DATED : August 7, 1984

INVENTOR(S) : Albert T. Crowley, et al.

It is certified that error appears in the above-identified patent and that said Letters Patent is hereby corrected as shown below:

Col. 3, line 31, change "$(f_{VCO} + f_M).$" to --$(f_{VCO} - f_M).$--.

Col. 3, line 32, change "$\omega_{AS}T,$" to --$\omega_{AS}t,$--.

Col. 5, line 52, change "measured" to --assumed--.

Col. 6, line 24, change "phase" to --phases--.

Col. 6, line 32, change "comparing" to --comprising--.

Signed and Sealed this

Twelfth Day of February 1985

[SEAL]

Attest:

DONALD J. QUIGG

Attesting Officer     Acting Commissioner of Patents and Trademarks